United States Patent [19]

Vanderschaaf

[11] Patent Number: 5,663,669

[45] Date of Patent: Sep. 2, 1997

[54] CIRCUITRY AND METHOD FOR LATCHING INFORMATION

[75] Inventor: Neil Ray Vanderschaaf, Round Rock, Tex.

[73] Assignee: International Business Machines Corporation, Armonk, N.Y.

[21] Appl. No.: 622,252

[22] Filed: Mar. 26, 1996

Related U.S. Application Data

[63] Continuation of Ser. No. 355,884, Dec. 14, 1994, abandoned.

[51] Int. Cl.[6] .................................................. H03K 19/096
[52] U.S. Cl. ............................ 327/201; 327/202; 327/208; 327/211
[58] Field of Search .................................. 327/199–203, 327/208–214, 224

[56] References Cited

U.S. PATENT DOCUMENTS

| 4,495,629 | 1/1985 | Zasio et al. . |
| 4,553,236 | 11/1985 | Zasio et al. . |
| 4,554,664 | 11/1985 | Schultz . |
| 4,569,067 | 2/1986 | Gallup . |
| 4,669,061 | 5/1987 | Bhavsar . |
| 4,733,405 | 3/1988 | Shimizume et al. . |
| 5,032,783 | 7/1991 | Hwang et al. . |
| 5,162,667 | 11/1992 | Yasui et al. . |
| 5,173,626 | 12/1992 | Kudou et al. . |
| 5,202,624 | 4/1993 | Gheewala et al. . |
| 5,227,674 | 7/1993 | Takahashi et al. . |
| 5,250,852 | 10/1993 | Ovens et al. . |
| 5,252,917 | 10/1993 | Kadowaki . |

FOREIGN PATENT DOCUMENTS

| 3443788 | 6/1986 | Germany | 327/203 |
| 406045879 | 2/1994 | Japan | 327/203 |

*Primary Examiner*—Timothy P. Callahan
*Assistant Examiner*—T. Lam
*Attorney, Agent, or Firm*—Michael A. Davis, Jr.

[57] ABSTRACT

A method and circuitry are provided for latching information. The information is selectively transferred from a selected one of: a first node (DIN) to a second node (416); and a third node (SIN) to a fourth node (419a–b). The transferred information is selectively latched by coupling the second node (416) to the fourth node (419a–b) in response to a signal (308, 410).

14 Claims, 12 Drawing Sheets

CIRCUITRY AND METHOD FOR LATCHING
INFORMATION

This is a continuation of application Ser. No. 08/355,884 filed Dec. 14, 1994 has been abandoned.

TECHNICAL FIELD

This patent application relates in general to electronic circuitry and in particular to a method and circuitry for latching information.

BACKGROUND OF THE INVENTION

Digital circuitry frequently includes circuitry for latching information. Commonly, such latching circuitry latches information input from a data input node and from a scan input node. The data input node and the scan input node are multiplexed to the latching circuitry, so the latching circuitry inputs information from no more than one of the data input node and the scan input node at any particular moment.

The data input node is connected to one or more functional units of the digital circuitry, consistent with the digital circuitry's primary functional purpose. By comparison, the scan input node is connected to one or more scan inputs of the digital circuitry, consistent with serial scan testing techniques. During normal operation of the digital circuitry, the latching circuitry latches a logic state of the data input node. During testing of the digital circuitry according to serial scan testing techniques, the latching circuitry is able to latch a logic state of the scan input node.

By latching the logic state of the scan input node instead of the data input node, the latching circuitry is more readily initialized to a predetermined logic state for testing purposes. This is because the latching circuitry bypasses one or more functional units (connected to the data input node) by latching logic states of the scan input node instead of the data input node. Nevertheless, parasitic capacitance results from the scan input node and its connected scan input circuitry. With typical previous techniques, this parasitic capacitance results in a speed penalty during normal operation of the digital circuitry where the latching circuitry latches information input from the data input node.

Thus, a need has arisen for a method and circuitry for latching information, in which parasitic capacitance (resulting from a scan input node and its connected scan input circuitry) results in less (relative to typical previous techniques) of a speed penalty during normal operation where latching circuitry latches information input from a data input node.

SUMMARY OF THE INVENTION

In a method and circuitry for latching information, the information is selectively transferred from a selected one of: a first node to a second node; and a third node to a fourth node. The transferred information is selectively latched by coupling the second node to the fourth node in response to a signal.

It is a technical advantage of the present invention that parasitic capacitance (resulting from a scan input node and its connected scan input circuitry) results in less (relative to typical previous techniques) of a speed penalty during normal operation where latching circuitry latches information input from a data input node.

BRIEF DESCRIPTION OF THE DRAWINGS

An illustrative embodiment of the present inventions and their advantages are better understood by referring to the following descriptions and accompanying drawings, in which.

DETAILED DESCRIPTION

An illustrative embodiment of the present inventions and their advantages are better understood by referring to FIGS. 1–7d of the drawings, like numbers being used for like and corresponding parts of the accompanying drawings.

Figure 1:
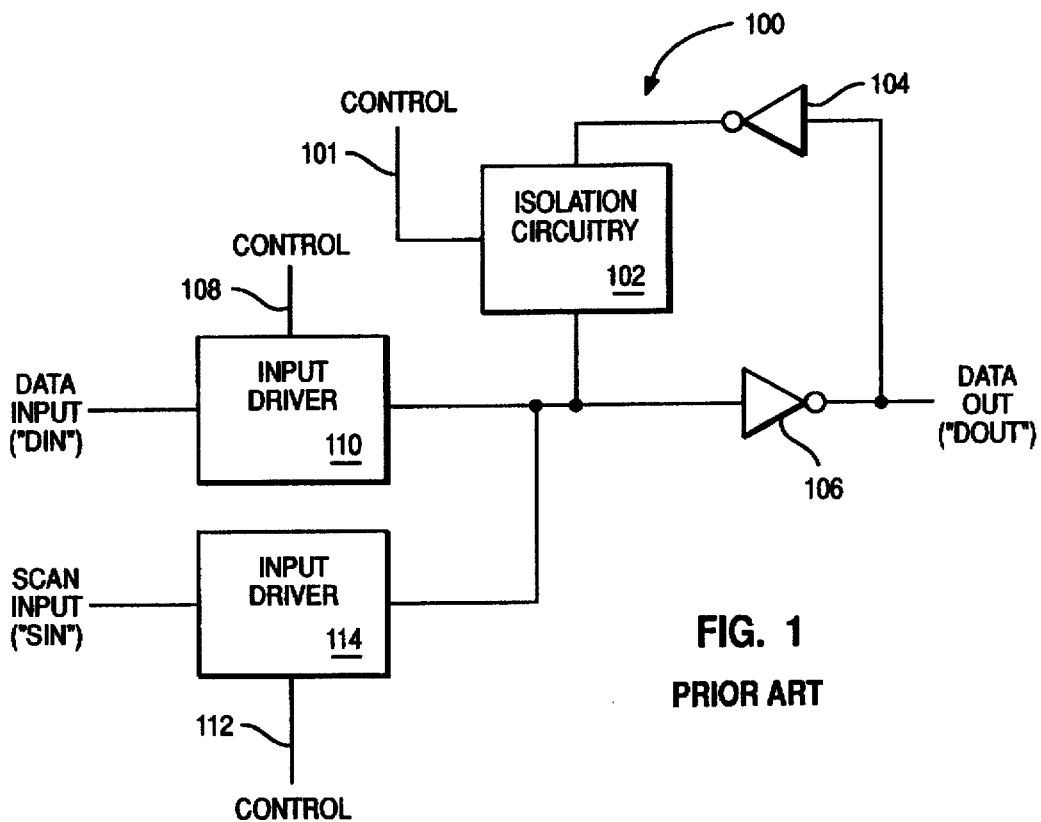
FIG. 1 is a block diagram of circuitry for latching information according to the prior art.

FIG. 1 is a block diagram of circuitry, indicated generally at 100, for latching information according to the prior art. Circuitry 100 can be included within integrated circuitry, such as an integrated circuit microprocessor. In response to a control line 101 being set to a logic one state, isolation circuitry 102 connects an output of an inverter 104 to an input of an inverter 106. By comparison, in response to control line 101 being cleared to a logic zero state, isolation circuitry 102 disconnects the output of inverter 104 from the input of inverter 106.

An output of inverter 106 is connected to an input of inverter 104 and to a data out ("DOUT") node. Accordingly, if isolation circuitry 102 connects the output of inverter 104 to the input of inverter 106, then circuitry 100 latches a logic state of the DOUT node. For example, if the DOUT node has a logic one state, then the output of inverter 104 has a logic zero state. In that situation, if isolation circuitry 102 connects the output of inverter 104 to the input of inverter 106, then the input of inverter 106 likewise has a logic zero state. Since the input of inverter 106 has a logic zero state, the logic state of the DOUT node is latched to a logic one state.

In response to a control line 108 being set to a logic one state, an input driver 110 connects a data input ("DIN") node to the input of inverter 106. By comparison, in response to control line 108 being cleared to a logic zero state, input driver 110 disconnects the DIN node from the input of inverter 106.

Similarly, in response to a control line 112 being set to a logic one state, an input driver 114 connects a scan input ("SIN") node to the input of inverter 106. By comparison, in response to control line 112 being cleared to a logic zero state, input driver 114 disconnects the SIN node from the input of inverter 106.

The DIN node is coupled to one or more functional units of the integrated circuitry, consistent with the integrated circuitry's primary functional purpose. By comparison, the SIN node is coupled to one or more scan inputs of the integrated circuitry, consistent with serial scan testing techniques.

In operation, no more than one of control lines 108 and 112 is set to a logic one state at any particular moment. If each of control lines 108 and 112 is cleared to a logic zero state, then circuitry 100 sets control line 101 to a logic one state so that circuitry 100 latches the logic state of the DOUT node. If one of control lines 108 and 112 is set to a logic one state, then circuitry 100 clears control line 101 to a logic zero state so that circuitry 100 does not latch the logic state of the DOUT node.

For example, if control line 108 is set to a logic one state, then circuitry 100 clears control line 101 to a logic zero state, and circuitry 100 does not latch the logic state of the DOUT node. In that situation, input driver 110 connects the DIN node to the input of inverter 106. After the DIN node's logic state remains stable for a suitable minimum setup time period, control line 108 is cleared to a logic zero state, and circuitry 100 sets control line 101 to a logic one state. In that manner, circuitry 100 latches the logic state of the DOUT node to be the one's complement of the DIN node's logic state which existed during the setup time period.

Likewise, if control line 112 is set to a logic one state, then circuitry 100 clears control line 101 to a logic zero state, and circuitry 100 does not latch the logic state of the DOUT node. In that situation, input driver 114 connects the SIN node to the input of inverter 106. After the SIN node's logic state remains stable for a suitable minimum setup time period, control line 112 is cleared to a logic zero state, and circuitry 100 sets control line 101 to a logic one state. In that manner, circuitry 100 latches the logic state of the DOUT node to be the one's complement of the SIN node's logic state which existed during the setup time period.

Accordingly, circuitry 100 is able to latch logic states of either the DIN node or the SIN node. During normal operation of integrated circuitry (which includes circuitry 100), circuitry 100 latches logic states of the DIN node. By comparison, during testing of the integrated circuitry according to serial scan testing techniques, circuitry 100 is able to latch logic states of the SIN node.

By latching logic states of the SIN node instead of the DIN node, the logic state the DOUT node is more readily initialized to a predetermined logic state for testing purposes. This is because circuitry 100 bypasses one or more functional units (connected to the DIN node) by latching logic states of the SIN node instead of the DIN node.

Figure 2:
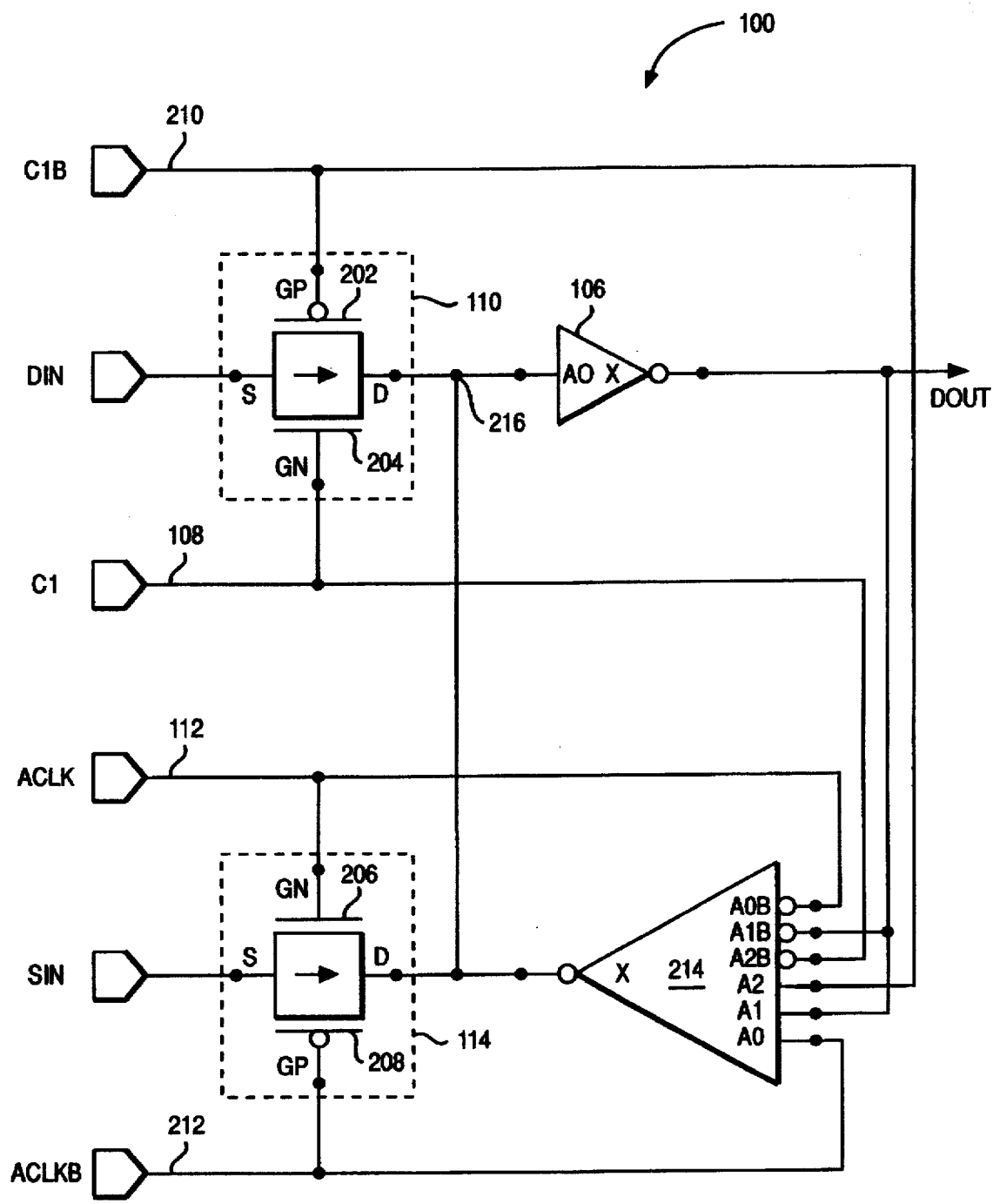
FIG. 2 is a schematic electrical circuit diagram of circuitry for latching information according to the block diagram of FIG. 1.

FIG. 2 is a schematic electrical circuit diagram of circuitry 100. As shown in FIG. 2, input driver 110 is a transfer gate including a p-channel field effect transistor 202 and an n-channel field effect transistor 204. Transistors 202 and 204 are connected to one another as shown in FIG. 2.

Likewise, input driver 114 is a transfer gate including a p-channel field effect transistor 208 and an n-channel field effect transistor 206. Transistors 206 and 208 are connected to one another as shown in FIG. 2.

Control line ("C1") 108 is connected to a gate of transistor 204. An inverted control line ("C1B") 210 is connected to a gate of transistor 206. A logic state of C1B is always the one's complement of C1's logic state.

Control line ("ACLK") 112 is connected to a gate of transistor 206. An inverted control line ("ACLKB") 212 is connected to a gate of transistor 208. A logic state of ACLKB is always the one's complement of ACLK's logic state 101

A feedback driver 214 includes isolation circuitry 102 and inverter 104 of FIG. 1. In operation, control lines 108, 112, 210 and 212 achieve the function of control line 101 of FIG. 1. Control lines 112 and 108 are connected to "logic false" inputs A0B and A2B, respectively, of feedback driver 214. Control lines 212 and 210 are connected to "logic true" inputs A0 and A2, respectively, of feedback driver 214. The DOUT node is connected to a "logic false" input A1B of feedback driver 214 and to a "logic true" input A1 of feedback driver 214.

Feedback driver 214 clears its output X to a logic zero state in response to "logic true" inputs A0, A1 and A2 all having a logic one state. By comparison, feedback driver 214 sets its output X to a logic one state in response to "logic false" inputs A0B, A1B and A2B all having a logic zero state.

In operation, no more than one of control lines 108 and 112 is set to a logic one state at any particular moment. If each of control lines 108 and 112 is cleared to a logic zero state, then each of inputs A0B and A2B has a logic zero state, and each of inputs A0 and A2 has a logic zero state. In that situation, feedback driver 214 achieves the function of inverter 104 (FIG. 1) by clearing its output X to a logic zero state in response to the DOUT node having a logic one state, and by setting its output X to a logic one state in response to the DOUT node having a logic zero state. Accordingly, if each of control lines 108 and 112 is cleared to a logic zero state, then circuitry 100 latches the logic state of the DOUT node.

By comparison, if one of control lines 108 and 112 is set to a logic one state, then feedback driver 214 achieves the function of isolation circuitry 102 (FIG. 1) by releasing its output X to be in a floating logic state so that circuitry 100 does not latch the logic state of the DOUT node. For example, if control line 108 is set to a logic one state, then input driver 110 connects the DIN node to the input of inverter 106. After the DIN node's logic state remains stable for a suitable minimum setup time period, control line 108 is cleared to a logic zero state, and circuitry 100 latches the logic state of the DOUT node to be the one's complement of the DIN node's logic state which existed during the setup time period.

Likewise, if control line 112 is set to a logic one state, then input driver 114 connects the SIN node to the input of inverter 106. After the SIN node's logic state remains stable for a suitable minimum setup time period, control line 112 is cleared to a logic zero state, and circuitry 100 latches the logic state of the DOUT node to be the one's complement of the SIN node's logic state which existed during the setup time period. Input driver 114 is connected between the SIN node and a node 216. Node 216 is a critical node, and its connection to input driver 114 results in additional parasitic capacitance at node 216 that would not otherwise exist if input driver 114 was not connected to node 216. With this additional parasitic capacitance, node 216 incurs a speed penalty during normal operation where circuitry 100 latches the logic state of the DOUT node to be the one's complement of the DIN node's logic state which existed during the setup time period. More particularly, in a shortcoming of the technique of FIGS. 1 and 2, the parasitic capacitance increases the minimum setup time period, as well as a suitable minimum hold time period for the DIN node's logic state to remain stable after control line 108 is cleared to a logic zero state.

Figure 3:
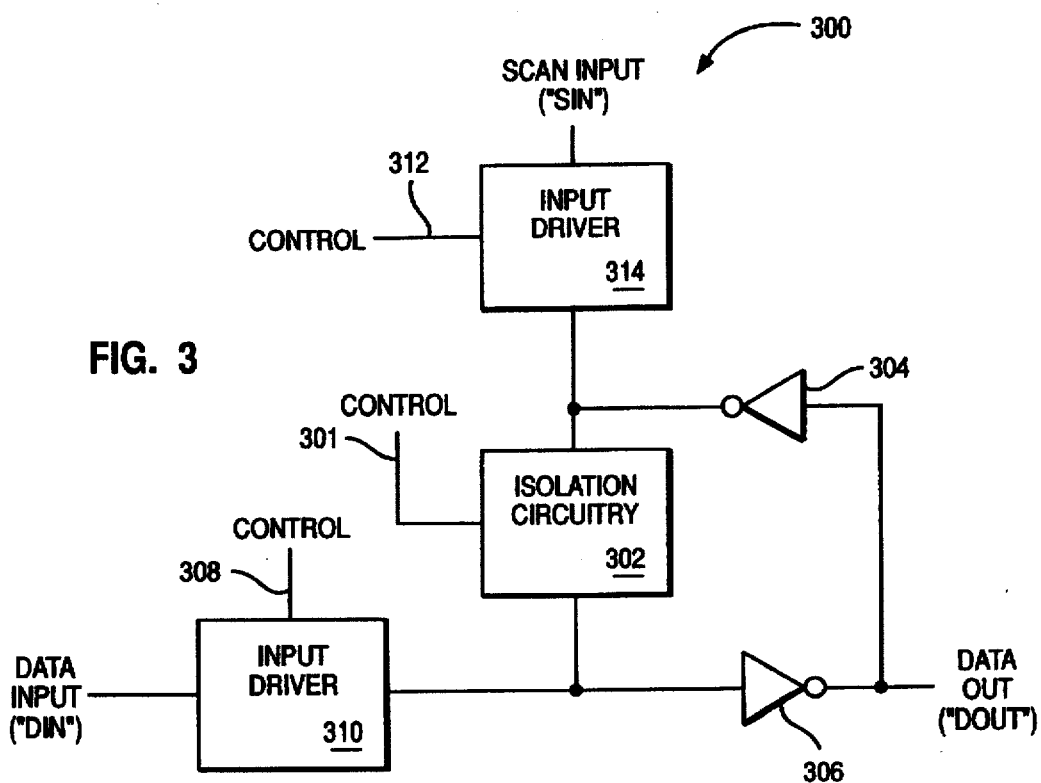
FIG. 3 is a block diagram of circuitry for latching information according to the illustrative embodiment.

FIG. 3 is a block diagram of circuitry, indicated generally at 300, for latching information according to the illustrative embodiment. Circuitry 300 can be included within integrated circuitry, such as an integrated circuit microprocessor. In response to a control line 301 being set to a logic one state (i.e. a signal on control line 301), isolation circuitry 302 connects an output of an inverter 304 to an input of an inverter 306. By comparison, in response to control line 301 being cleared to a logic zero state, isolation circuitry 302 disconnects (i.e. electrically isolates) the output of inverter 304 from the input of inverter 306. Such electrical isolation is achieved by creating a high impedance between the output of inverter 304 and the input of inverter 306.

An output of inverter 306 is connected to an input of inverter 304 and to a data out ("DOUT") node. Accordingly, if isolation circuitry 302 connects the output of inverter 304 to the input of inverter 306, then circuitry 300 latches a logic state of the DOUT node. For example, if the DOUT node has a logic one state, then the output of inverter 304 has a logic zero state. In that situation, if isolation circuitry 302 connects the output of inverter 304 to the input of inverter 306, then the input of inverter 306 likewise has a logic zero state. Since the input of inverter 306 has a logic zero state, the logic state of the DOUT node is latched to a logic one state.

In response to a control line 308 being set to a logic one state, an input driver 310 connects a data input ("DIN") node to the input of inverter 306, such that information is transferred from the DIN node to the input of inverter 306. By comparison, in response to control line 308 being cleared to a logic zero state, input driver 310 disconnects the DIN node from the input of inverter 306.

In a significant aspect of the illustrative embodiment, an output of an input driver 314 is connected to the output of inverter 304. By comparison, in FIG. 1, the output of input driver 114 is connected to the input of inverter 106. In response to a control line 312 being set to a logic one state, input driver 314 connects a scan input ("SIN") node to the output of inverter 304, such that information is transferred from the SIN node to the output of inverter 304. By comparison, in response to control line 312 being cleared to a logic zero state, input driver 314 disconnects the SIN node from the output of inverter 304.

The DIN node is coupled to one or more functional units of the integrated circuitry, consistent with the integrated circuitry's primary functional purpose. By comparison, the SIN node is coupled to one or more scan inputs of the integrated circuitry, consistent with serial scan testing techniques.

In operation, no more than one of control lines 308 and 312 is set to a logic one state at any particular moment. If control line 308 is set to a logic one state, then circuitry 300 clears control line 301 to a logic zero state so that circuitry 300 does not latch the logic state of the DOUT node. If control line 308 is cleared to a logic zero state, then circuitry 300 sets control line 301 to a logic one state so that circuitry 300 latches the logic state of the DOUT node. By comparison, control line 301 remains set to a logic one state even while circuitry 300 sets control line 312 to a logic one state, so that circuitry 300 latches the logic state of the DOUT node to be the one's complement of the SIN node.

For example, if control line 308 is set to a logic one state, then circuitry 300 clears control line 301 to a logic zero state, and circuitry 300 does not latch the logic state of the DOUT node. In that situation, input driver 310 connects the DIN node to the input of inverter 306. After the DIN node's logic state remains stable for a suitable minimum setup time period, control line 308 is cleared to a logic zero state, and circuitry 300 sets control line 301 to a logic one state. In that manner, circuitry 300 latches the logic state of the DOUT node to be the one's complement of the DIN node's logic state which existed during the set-up time period.

Accordingly, circuitry 300 is able to latch logic states of either the DIN node or the SIN node. During normal operation of integrated circuitry (which includes circuitry 300), circuitry 300 latches logic states of the DIN node. By comparison, during testing of the integrated circuitry according to serial scan testing techniques, circuitry 300 is able to latch logic states of the SIN node. By latching logic states of the SIN node instead of the DIN node, the logic state of the DOUT node is more readily initialized to a predetermined logic state for testing purposes. This is because circuitry 300 bypasses one or more functional units (connected to the DIN node) by latching logic states of the SIN node instead of the DIN node.

Figure 4:
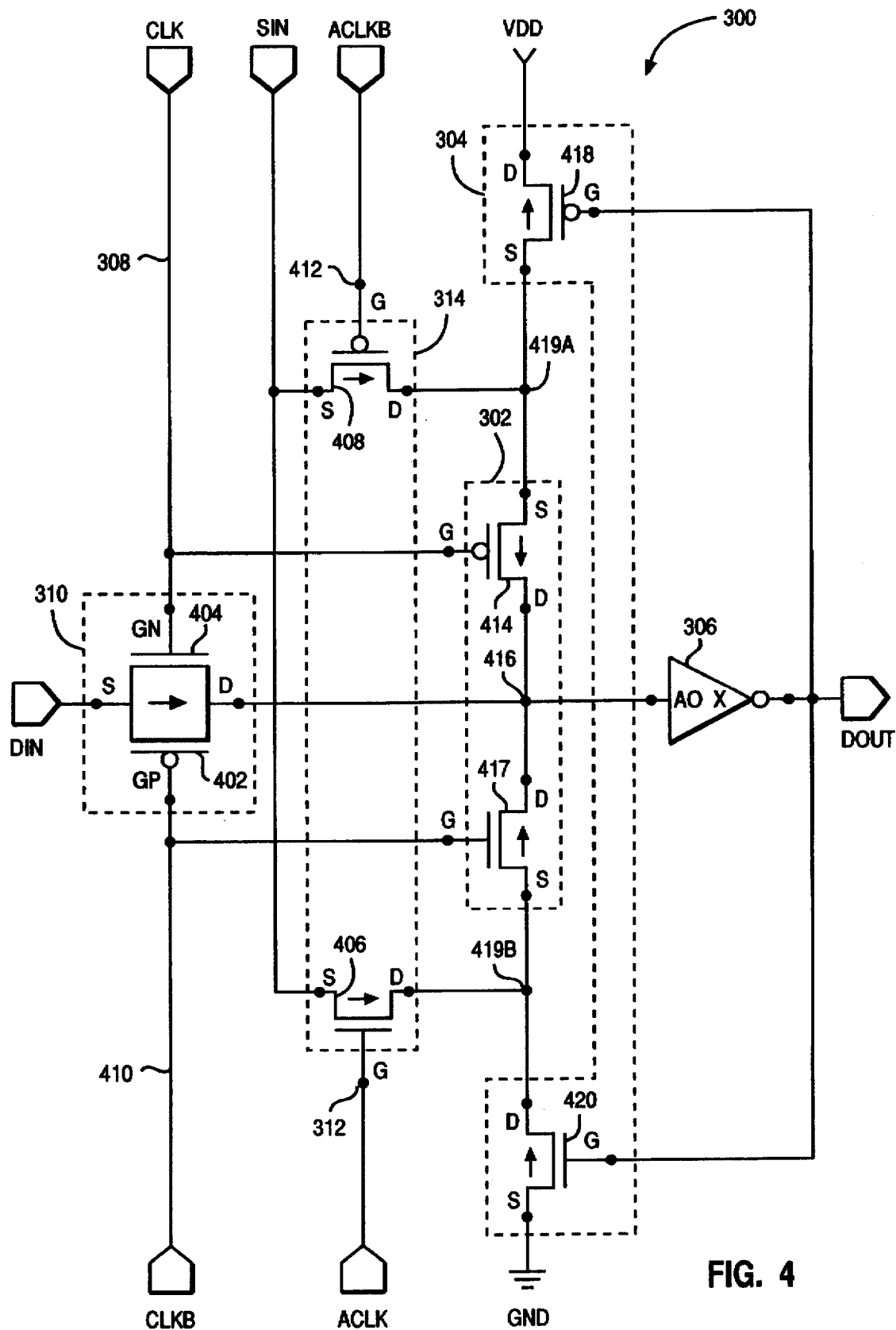
FIG. 4 is a schematic electrical circuit diagram of circuitry for latching information according to the block diagram of FIG. 3.

FIG. 4 is a schematic electrical circuit diagram of circuitry 300. As shown in FIG. 4, input driver 310 is a transfer gate including a p-channel field effect transistor 402 and an n-channel field effect transistor 404. Transistors 402 and 404 are connected to one another as shown in FIG. 4.

Likewise, input driver 314 is a transfer gate including a p-channel field effect transistor 408 and an n-channel field effect transistor 406. Transistors 406 and 408 are connected to one another as shown in FIG. 4.

Control line ("CLK") 308 is connected to a gate of transistor 404. An inverted control line ("CLKB") 410 is connected to a gate of transistor 406. A logic state of CLKB is always the one's complement of CLK's logic state.

Control line ("ACLK") 312 is connected to a gate of transistor 406. An inverted control line ("ACLKB") 412 is connected to a gate of transistor 408. A logic state of ACLKB is always the one's complement of ACLK's logic state.

Isolation circuitry 302 includes a p-channel field effect transistor 414 and an n-channel field effect transistor 417. Inverter 304 is a complementary metal oxide semiconductor ("CMOS") inverter including a p-channel field effect transistor 418 and an n-channel field effect transistor 420. In operation, control lines 308 and 410 achieve the function of control line 301 of FIG. 3.

No more than one of control lines 308 and 312 is set to a logic one state at any particular moment. If control line 308 is cleared to a logic zero state (such that control line 410 is set to a logic one state), then each of transistors 414 and 417 is turned on. Since each of transistors 414 and 417 is turned on, a low resistance electrical connection is formed between a node 416 (connected to the input of inverter 306) and nodes 419a–b (connected to sources of transistors 414 and 417, respectively). As a result of this low resistance electrical connection, node 416 is subject to control by inverter 304.

More particularly, in that situation, inverter 304 clears node 416 to a logic zero state in response to the DOUT node having a logic one state, and inverter 304 sets node 416 to a logic one state in response to the DOUT node having a logic zero state. Accordingly, if control line 308 is cleared to a logic zero state, then circuitry 300 latches the logic state of the DOUT node.

By comparison, if control line 308 is set to a logic one state (such that control line 410 is cleared to a logic zero state), then each of transistors 414 and 417 is turned off. In that situation, node 416 is not subject to control by inverter 304.

More particularly, in that situation, isolation circuitry 302 releases node 416 to be in a floating logic state so that circuitry 300 does not latch the logic state of the DOUT node. For example, if control line 308 is set to a logic one state, then input driver 310 connects the DIN node to the input of inverter 306. After the DIN node's logic state remains stable for a suitable minimum setup time period, control line 308 is cleared to a logic zero state (such that control line 410 is set to a logic one state), and circuitry 300 latches the logic state of the DOUT node to be the one's complement of the DIN node's logic state which existed during the setup time period.

Likewise, if control line 312 is set to a logic one state (such that control line 412 is cleared to a logic zero state), then input driver 314 connects the SIN node to the output of inverter 304 (i.e. to nodes 419a–b connected to the sources of transistors 414 and 417, respectively). Circuitry 300 clears control line 308 to a logic zero state while circuitry 300 sets control line 312 to a logic one state. After the SIN node's logic state remains stable for suitable minimum time period for circuitry 300 to latch the logic state of the DOUT node to be the one's complement of the SIN node, control line 312 is cleared to a logic zero state (such that control line 412 is set to a logic one state).

In the illustrative embodiment, transistors 406 and 408 have sufficiently large channel widths to override any previously latched logic state of the DOUT node. Notably, for various integrated circuitry applications, it is practically inconsequential whether node 416 incurs a speed penalty during testing of the integrated circuitry according to serial scan testing techniques (where circuitry 300 latches the logic state of the DOUT node to be the one's complement of the SIN node's logic state which existed during the setup time period).

Node 416 is a critical node, and it is not directly connected to input driver 314. In FIG. 4, node 416 is connected to six transistors (402, 404, 414, 417 and two transistors (not shown) of inverter 306). By comparison, in FIG. 2, node 216 is connected to at least eight transistors. Accordingly, node 416, is connected to fewer transistors than node 216 (FIG. 2) and is advantageously subject to less parasitic capacitance than node 216 of FIG. 2.

With less parasitic capacitance, node 416 incurs less (relative to node 216) of a speed penalty during normal operation (where circuitry 300 latches the logic state of the DOUT node to be the one's complement of the DIN node's logic state which existed during the setup time period). More particularly, in a significant technical advantage of the technique of FIGS. 3 and 4, the diminished parasitic capacitance results in a shorter minimum setup time period, as well as a shorter minimum hold time period for the DIN node's logic state to remain stable after control line 308 is cleared to a logic zero state.

Advantageously, circuitry 300 of FIG. 4 can be implemented with less integrated circuitry layout area than circuitry 100 of FIG. 2. This is because circuitry 300 includes fewer transistors than circuitry 100. Channel widths of transistors within circuitry 300 can be suitably sized to achieve various combinations of goals. Relative to circuitry 100, circuitry 300 is able to achieve shorter (by approximately 1% to 10%) minimum setup/hold time periods while consuming approximately the same power. Also, relative to circuitry 100, circuitry 300 is able to achieve approximately the same minimum setup/hold time periods while consuming less power.

FIGS. 5a–d are schematic electrical circuit diagrams of alternative implementations of circuitry 300. The implementation selected for a particular integrated circuitry application is a function of available technology and other integrated circuitry design factors (e.g. layout area). More particularly, in the alternative implementation of circuitry 300 shown in FIG. 5a, transistor 406 is excluded.

Figure 5A:
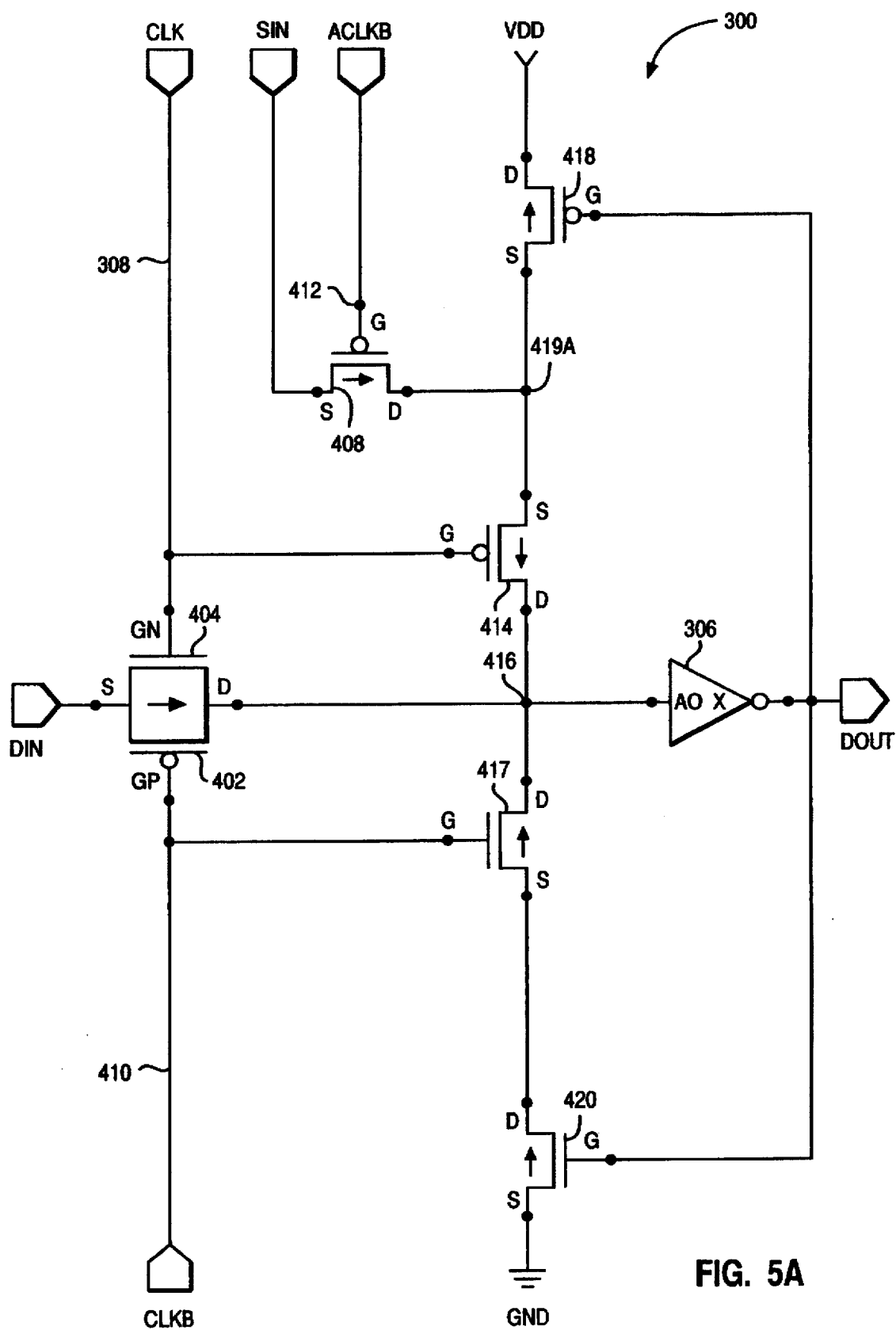
FIGS. 5a–d are schematic electrical circuit diagrams of alternative implementations of the circuitry of FIG. 4.
Figure 5B:
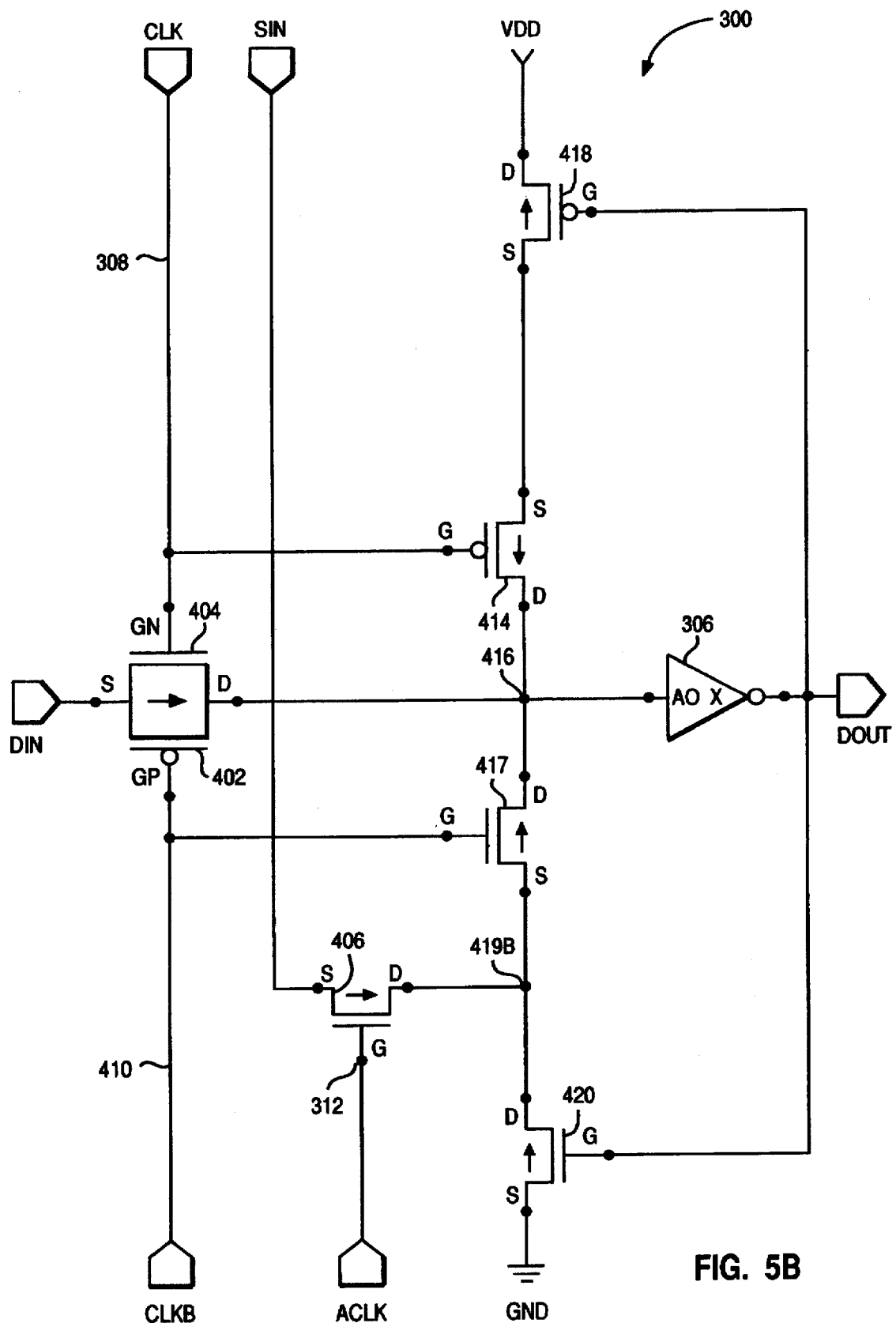
Figure 5C:
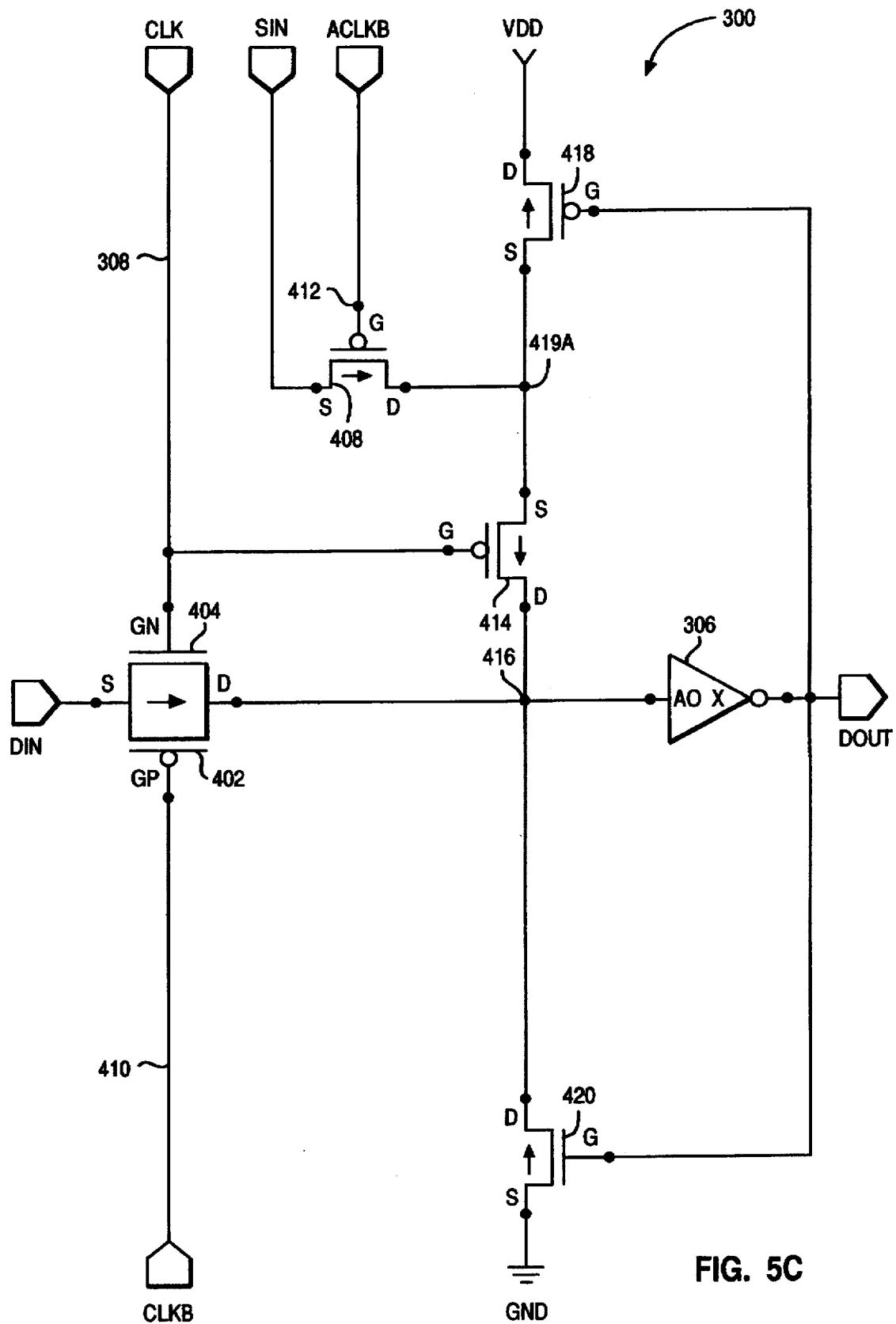
Figure 5D:
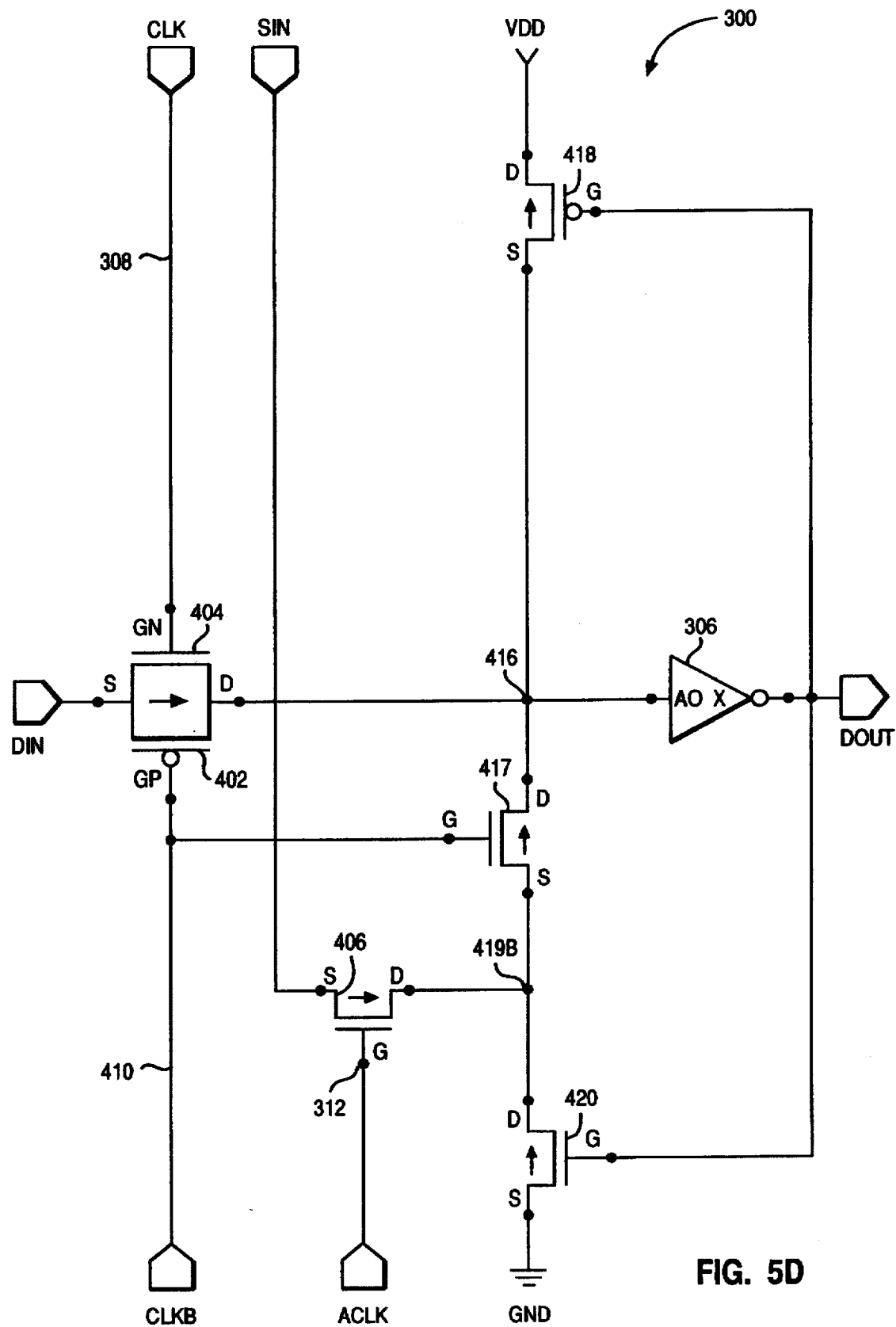

In the alternative implementation of circuitry 300 shown in FIG. 5b, transistor 406 is included, and transistor 408 is excluded. In the alternative implementation of circuitry 300 shown in FIG. 5c, transistors 406 and 417 are excluded; transistor 420 is directly connected to node 416. In the alternative implementation of circuitry 300 shown in FIG. 5d, transistors 408 and 414 are excluded; transistor 418 is directly connected to node 416.

Figure 6:
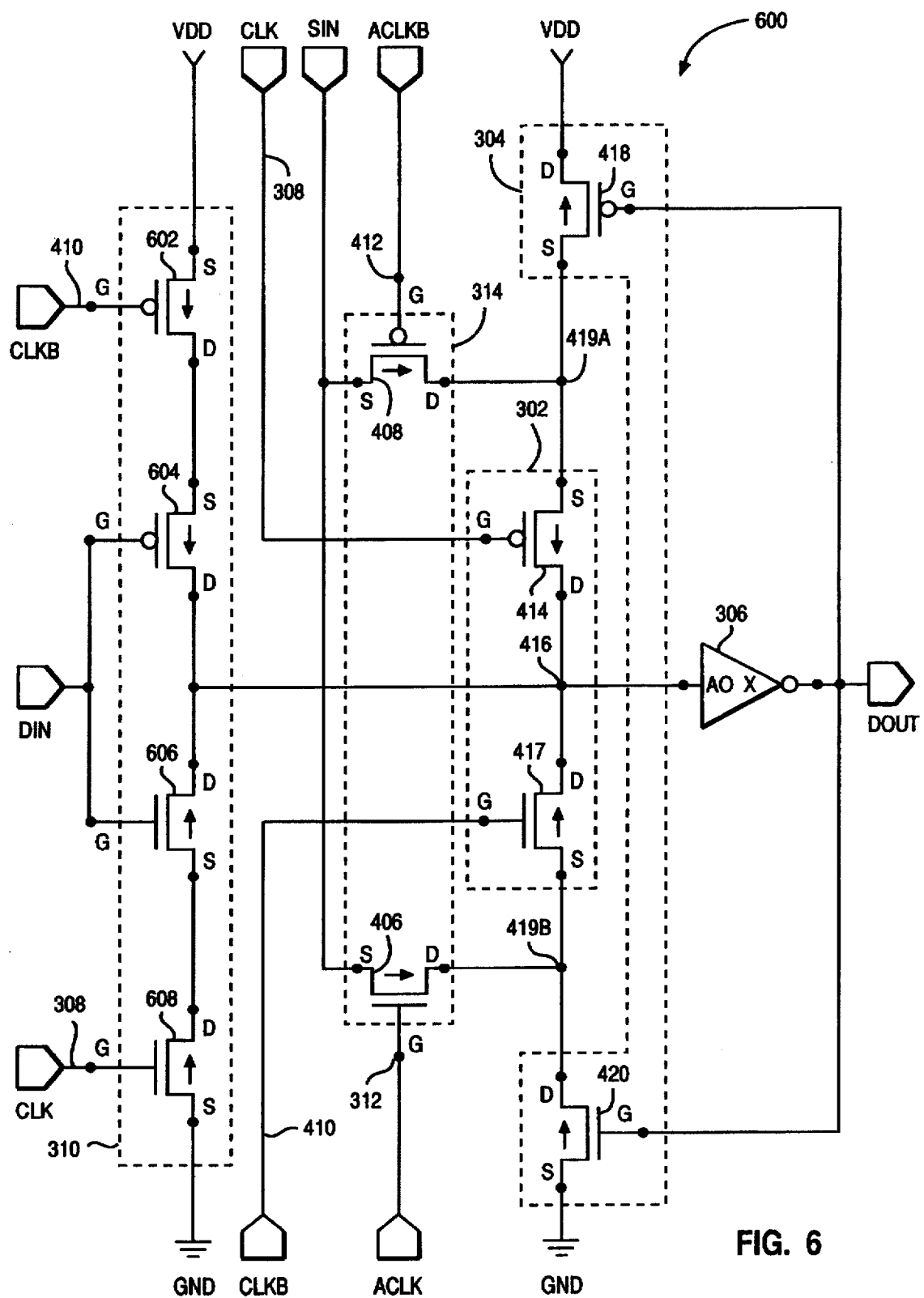
FIG. 6 is a schematic electrical circuit diagram of alternative circuitry for latching information according to the block diagram of FIG. 3.

FIG. 6 is a schematic electrical circuit diagram of alternative circuitry 600 for latching information according to the block diagram of FIG. 3. The only difference between circuitry 600 and circuitry 300 (FIG. 4) is the implementation of input driver 310. More particularly, in circuitry 600, input driver 310 does not include transistors 402 and 404 (FIG. 4).

Instead, input driver 310 (FIG. 6) includes p-channel field effect transistors 602 and 604 and n-channel field effect transistors 606 and 608 connected as shown in FIG. 6. CLK 308 is connected to a gate of transistor 608, CLKB 410 is connected to a gate of transistor 602, and the DIN node is connected to gates of transistors 604 and 606. Otherwise, circuitry 600 and circuitry 300 (FIG. 4) are logically, functionally and operationally identical.

FIGS. 7a–d are schematic electrical circuit diagrams of alternative implementations of circuitry 600. The implementation selected for a particular integrated circuitry application is a function of available technology and other integrated circuitry design factors (e.g. layout area). More particularly, in the alternative implementation of circuitry 600 shown in FIG. 7a, transistor 406 is excluded.

Figure 7A:
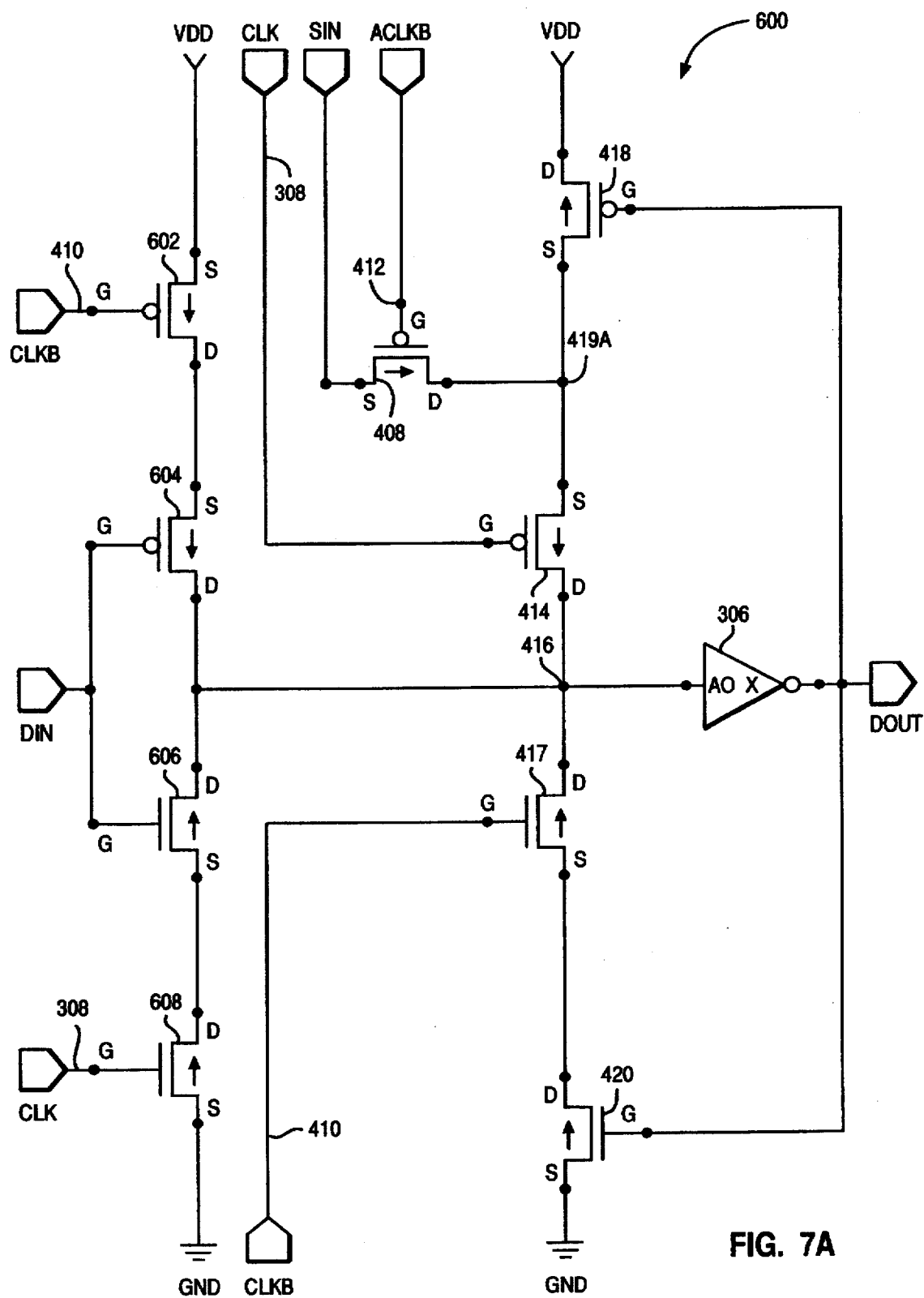
FIGS. 7a–d are schematic electrical circuit diagrams of alternative implementations of the circuitry of FIG. 6.
Figure 7B:
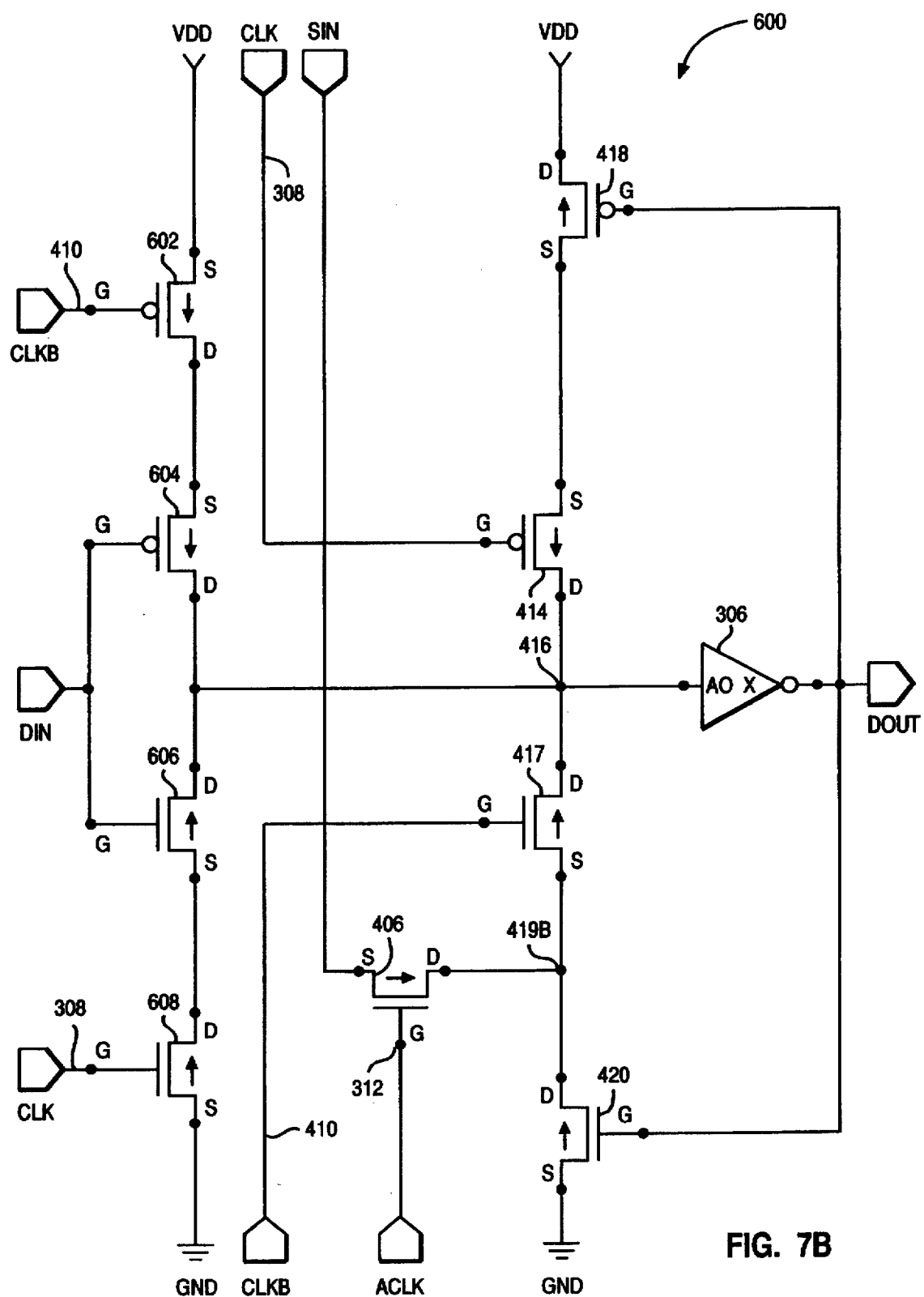
Figure 7C:
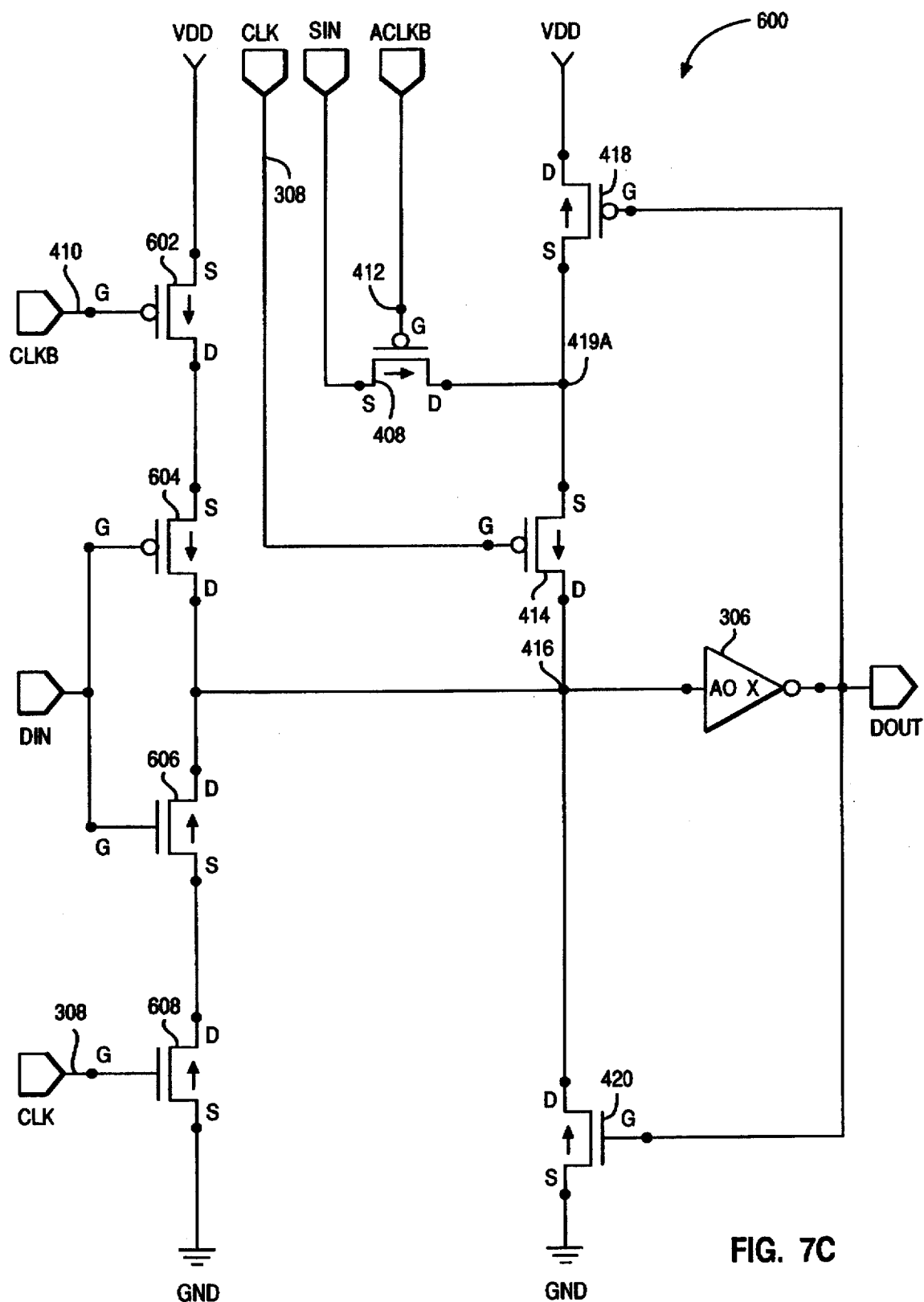
Figure 7D:
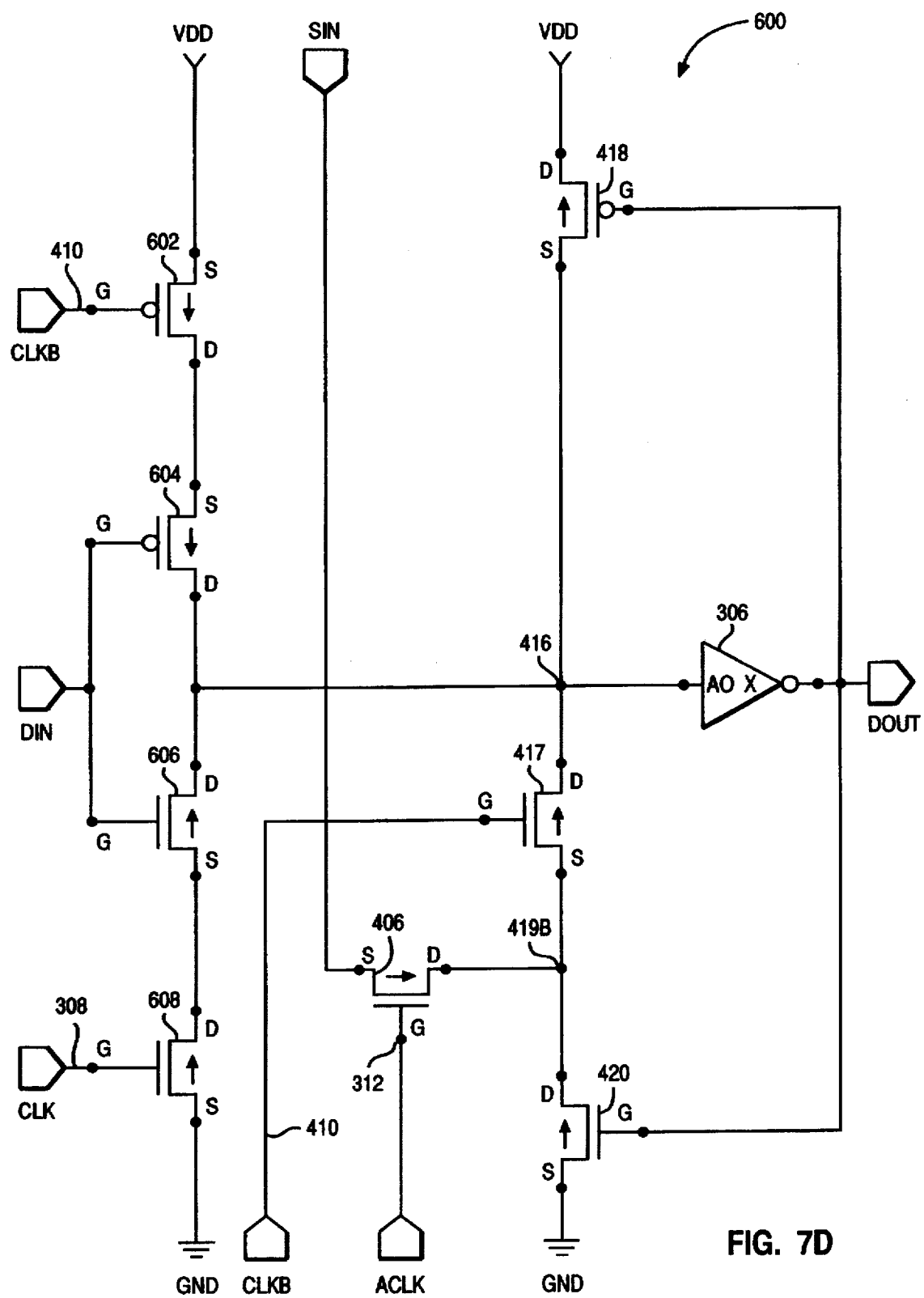

In the alternative implementation of circuitry 600 shown in FIG. 7b, transistor 406 is included, and transistor 408 is excluded. In the alternative implementation of circuitry 600 shown in FIG. 7c, transistors 406 and 417 are excluded; transistor 420 is directly connected to node 416. In the alterative implementation of circuitry 600 shown in FIG. 7d, transistors 408 and 414 are excluded; transistor 418 is directly connected to node 416.

Although an illustrative embodiment of the present inventions and their advantages have been described in detail hereinabove, it has been described as example and not as limitation. Various changes, substitutions and alterations can be made in the illustrative embodiment without departing from the breadth, scope and spirit of the present inventions. The breadth, scope and spirit of the present inventions should not be limited by the illustrative embodiment, but should be defined only in accordance with the following claims and equivalents thereof.

What is claimed is:

1. Circuitry, comprising:

transferring circuitry for transferring:

first information from a first node to a second node in response to a first signal only if said first signal has a first logic state; and second information from a third node to a fourth node in response to a second signal only if said second signal has a predetermined logic state; and latching circuitry for latching said transferred second information by coupling said second node to said fourth node in response to said first signal only if said first signal has a second logic state different than said first logic state, wherein said first signal has said second logic state in response to said second signal having said predetermined logic state, so that said transferred second information is latched while said second signal has said predetermined logic state.

2. The circuitry of claim 1 wherein said latching circuitry comprises:

a first inverter having an input coupled to said second node and having an output coupled to a fifth node;

a second inverter having an input coupled to said fifth node and having an output coupled to said fourth node; and isolation circuitry coupled between said second node and said fourth node for coupling said second node to said fourth node in response to said first signal only if said first signal has said second logic state, so that said transferred second information is latched;

wherein said transferring circuitry comprises one or more transistors coupled between said third node and said fourth node and having sufficiently large channel width to override a previously latched logic state of said fifth node so that said transferred second information is latched by said first and second inverters while said second signal has said predetermined logic state.

3. The circuitry of claim 2 wherein said latching circuitry is further operable to latch said transferred first information by coupling said second node to said fourth node in response to said first signal only if said first signal has said second logic state, wherein aid first signal has said second logic state in response to said first signal having said first logic state for at least a minimum setup time period, so that said transferred first information is latched while said first signal has said second logic state.

4. The circuitry of claim 3 wherein said third node is scan input node.

5. The circuitry of claim 4 wherein said first node is data input node.

6. The circuitry of claim 5 wherein said fifth node is an output node.

7. A method of latching information, comprising the steps of:

transferring first information from a first node to a second node in response to a first signal only if said first signal has a first logic state;

transferring second information from a third node to a fourth node in response to a second signal only if said second signal has a predetermined logic state; and latching said transferred second information by coupling said second node to said fourth node in response to said first signal only if said first signal has a second logic state different than said first logic state, wherein said first signal has said second logic state in response to said second signal having said predetermined logic state, so that said transferred second information is latched while said second signal has said predetermined logic state.

8. The method of claim 7 wherein said step of transferring said second information comprises the step of overriding a previously latched logic state of a fifth node so that said transferred second information is latched by first and second inverters while said second signal has said predetermined logic state, said first inverter having an input being coupled to said second node and having an output coupled to said fifth node, and said second inverter having an input being coupled to said fifth node and having an output coupled to said fourth node.

9. The method of claim 8 and further comprising the step of latching said transferred first information by coupling said second node to said fourth node in response to said first signal only if said first signal has said second logic state, wherein said first signal has said second logic state in response to said first signal having said first logic state for at least a minimum setup time period, so that said transferred first information is latched while said first signal has said second logic state.

10. The method of claim 9 wherein said third node is a scan input node.

11. The method of claim 10 wherein said first node is a data input node.

12. The method of claim 11 wherein said fifth node is an output node.

13. Circuitry, comprising:

transferring circuitry for transferring:
first information from a data input node to a first node in response to a first signal only if said first signal has a first logic state; and
second information from a scan input node to a second node in response to a second signal only if said second signal has a predetermined logic state; and latching circuitry for latching said transferred second information by coupling said first node to said second node in response to said first signal only if said first signal has a second logic state different than said first logic state, wherein said first signal has said second logic state in response to said second signal having said predetermined logic state, so that said transferred second information is latched while said second signal has said predetermined logic state, said latching circuitry comprising:

a first inverter having:
an input directly connected to said first node; and
an output directly connected to an output node;

a second inverter having:
an input directly connected to said output node; and
an output directly connected to said second node; and isolation circuitry coupled between said first node and said second node for coupling said first node to said second node in response to said first signal only if said first signal has said second logic state, so that said transferred second information is latched;

wherein said transferring circuitry comprises one or more transistors coupled between said scan input node and said second node and having sufficiently large channel width to override a previously latched logic state of said output node so that said transferred second information is latched by said first and second inverters while said second signal has said predetermined logic state.

14. The circuitry off claim 13 wherein said latching circuitry is further operable to latch said transferred first information by coupling said second node to said fourth node in response to said first signal only if said first signal has said second logic state, wherein said first signal has said second logic state in response to said first signal having said first logic state for at least a minimum setup time period, so that said transferred first information is latched while said first signal has said second logic state.

* * * * *